United States Patent
Wang

(10) Patent No.: US 10,026,925 B2
(45) Date of Patent: Jul. 17, 2018

(54) OLED DISPLAY SCREEN AND METHOD OF MANUFACTURING THE SAME, AND DISPLAY APPARATUS

(71) Applicant: BOE TECHNOLOGY GROUP CO., LTD., Beijing (CN)

(72) Inventor: Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/527,295

(22) PCT Filed: Sep. 26, 2016

(86) PCT No.: PCT/CN2016/100105
§ 371 (c)(1),
(2) Date: May 16, 2017

(87) PCT Pub. No.: WO2017/128749
PCT Pub. Date: Aug. 3, 2017

(65) Prior Publication Data
US 2018/0108862 A1    Apr. 19, 2018

(30) Foreign Application Priority Data
Jan. 27, 2016    (CN) .......................... 2016 1 0055000

(51) Int. Cl.
*H01L 51/52*    (2006.01)
*H01L 51/50*    (2006.01)
*H01L 51/00*    (2006.01)

(52) U.S. Cl.
CPC ...... *H01L 51/5253* (2013.01); *H01L 51/0097* (2013.01); *H01L 51/525* (2013.01); *H01L 2251/5338* (2013.01); *H01L 2251/558* (2013.01)

(58) Field of Classification Search
None
See application file for complete search history.

(56) References Cited

U.S. PATENT DOCUMENTS 9,054,340 B2 *   6/2015   Kim ...................... H01L 51/56
2012/0256202 A1  10/2012  Lee et al.
(Continued)

FOREIGN PATENT DOCUMENTS

CN    103109389 A    5/2013
CN    104599597 A    5/2015
(Continued)

OTHER PUBLICATIONS

English Translation of International Search Report and Written Opinion, for PCT Patent Application No. PCT/CN2016/100105, dated Jan. 4, 2017, 7 pages.
(Continued)

*Primary Examiner* — Joseph Schoenholtz
(74) *Attorney, Agent, or Firm* — Kinney & Lange, P.A.

(57) ABSTRACT

The present application discloses an OLED display screen and a display apparatus including the display screen and a method of manufacturing the OLED display screen. The OLED display screen includes a flexible substrate, an OLED device and a packaging layer; wherein, the packaging layer includes a reinforcement part located in a predefined bending region of the display screen.

18 Claims, 2 Drawing Sheets

(56) References Cited

U.S. PATENT DOCUMENTS

| | | | |
|---|---|---|---|
| 2015/0001483 A1* | 1/2015 | Namkung | H01L 27/3244 257/40 |
| 2015/0124193 A1 | 5/2015 | Yoshikawa et al. | |
| 2015/0179728 A1* | 6/2015 | Kwon | H01L 27/3276 257/40 |
| 2016/0062520 A1* | 3/2016 | Choi | H01L 27/3248 345/174 |
| 2016/0240817 A1* | 8/2016 | Cho | H01L 51/5256 |
| 2016/0254489 A1* | 9/2016 | Sun | H01L 51/56 257/40 |
| 2016/0359132 A1 | 12/2016 | Sun | |

FOREIGN PATENT DOCUMENTS

| | | |
|---|---|---|
| CN | 104600208 A | 5/2015 |
| CN | 105044957 A | 11/2015 |
| CN | 105185809 A | 12/2015 |
| CN | 105679500 A | 6/2016 |

OTHER PUBLICATIONS

First Chinese Office Action, for Chinese Patent Application No. 201610055000.0, dated Feb. 26, 2018, 16 pages.

* cited by examiner

OLED DISPLAY SCREEN AND METHOD OF MANUFACTURING THE SAME, AND DISPLAY APPARATUS

CROSS-REFERENCE TO RELATED APPLICATION

This application claims the benefit of Chinese Patent Application No. 201610055000.0 filed on Jan. 27, 2016 in the State Intellectual Property Office of China, the whole disclosure of which is incorporated herein by reference.

BACKGROUND

1. Technical Field

The present disclosure relates to an OLED display screen and a method of manufacturing the same and a display apparatus including the same, and particularly to a package structure for a flexible OLED display screen.

2. Description of the Related Art

OLED (organic electroluminescence) device is considered to be the most promising flat panel display device, and also is considered to be a display technology which is the most likely to produce flexible display device. However, life problem of the OLED device restricts its industrialization pace. When an OLED device works, electrons are injected from a cathode to a transport layer. In order to increase quantity of the injected carriers and to improve luminous efficiency, cathode of the OLED is made of a material having the similar work function to that of a light emitting layer, to reduce energy barrier. However, these metals having low work function, such as magnesium, aluminum, silver, are active materials which will react easily with water vapor and oxygen in the environment, so that the device fails. At the same time, Hole Transport Layer (HTL) and Electron Transport Layer (ETL) are vulnerable to be eroded by water vapor and oxygen, which leads to damage of the pixels, thereby shortening life of the device. Accordingly, packaging technology is very important in manufacture of the OLED device. Effective packaging can prevent erosion of water vapor and oxygen and avoid aging of the organic material and thus prolong life of the OLED device.

At present, reliability of packaging of the OLED mainly depends on Thin Film Encapsulation (TFE). Structure for the TFE is a multi-layer stack structure consisted of organic and inorganic layers, in which the inorganic layer achieves a barrier effect to water vapor and oxygen while the organic layer achieves planarization effect.

For a flexible OLED device having a fixed bending region, repetition of the bending actions occurs in the bending region, TFE film is easy to be damaged, and reliability of packaging of this region affects final life of the OLED device.

SUMMARY

In the embodiments according to an aspect of the present disclosure, there is provided an OLED display screen comprising a flexible substrate, an OLED device and a packaging layer arranged and laminated orderly; wherein, the packaging layer comprises a reinforcement part located in a predefined bending region of the display screen.

According to an embodiment of the present disclosure, the packaging layer comprises at least one inorganic layer and at least one organic layer arranged and laminated.

According to an embodiment of the present disclosure, the reinforcement part is provided in the organic layer.

According to an embodiment of the present disclosure, the display screen has a display face for displaying image, and the display screen comprises a segment where the display face is expected to be bent outwardly and/or a segment where the display face is expected to be bent inwardly.

According to an embodiment of the present disclosure, the OLED display screen is a top-emission type OLED display screen, and, in the segment of the display screen where the display face is expected to be bent outwardly, the reinforcement part comprises a thickened part of the organic layer at the predefined bending region; or, wherein, the OLED display screen is a bottom-emission type OLED display screen, and, in the segment of the display screen where the display face is expected to be bent inwardly, the reinforcement part comprises the thickened part of the organic layer at the predefined bending region.

According to an embodiment of the present disclosure, an increment in thickness of the thickened part is not greater than 1.5 times of a thickness of a remaining part of the organic layer.

According to an embodiment of the present disclosure, an increment in thickness of the thickened part increases with the decrease of a predefined bending radius or decreases with the increase of the predefined bending radius, at the predefined bending region of the display screen.

According to an embodiment of the present disclosure, a thickness of the thickened part is maximal at a bending point of the predefined bending region and is gradually decreased from the bending point towards both directions away from the bending point.

According to an embodiment of the present disclosure, the OLED display screen is a top-emission type OLED display screen, and, in the segment of the display screen where the display face is expected to be bent inwardly, the reinforcement part comprises a thinned part of the organic layer at the predefined bending region; or, wherein, the OLED display screen is a bottom-emission type OLED display screen, and, in the segment of the display screen where the display face is expected to be bent outwardly, the reinforcement part comprises the thinned part of the organic layer at the predefined bending region.

According to an embodiment of the present disclosure, a decrease in thickness of the thinned part is not greater than 0.5 times of a thickness of a remaining part of the organic layer.

According to an embodiment of the present disclosure, a thickness of the thinned part decreases with the decrease of a predefined bending radius or increases with the increase of the predefined bending radius, at the predefined bending region of the display screen.

According to an embodiment of the present disclosure, a thickness of the thinned part is minimal at a bending point of the predefined bending region and is gradually increased from the bending point towards both directions away from the bending point.

According to an embodiment of the present disclosure, the reinforcement part is located at an intermediate area of the display screen in a transverse length or in a longitudinal length.

According to an embodiment of the present disclosure, the reinforcement part is located at an area between one third and one half of the display screen in a longitudinal or transverse length.

In the embodiments according to another aspect of the present disclosure, there is provided a display apparatus comprising the abovementioned OLED display screen.

In the embodiments according to yet another aspect of the present disclosure, there is provided method of manufacturing the abovementioned OLED display screen, and the method comprises:

providing a flexible substrate;
fabricating an OLED device on the flexible substrate;
fabricating an inorganic layer on the OLED device; and
fabricating an organic layer on the inorganic layer;
wherein, in the process of fabricating the organic layer, a thickened part and/or a thinned part is formed on a local position of the organic layer, the local position corresponding to a predefined bending region of the display screen.

According to an embodiment of the present disclosure, for a top-emission type OLED display screen, forming a thickened part in the organic layer, in a segment of the display screen where a display face is expected to be bent outwardly; or for a bottom-emission type OLED display screen, forming the thickened part in the organic layer, in a segment of the display screen where the display face is expected to be bent inwardly.

According to an embodiment of the present disclosure, for a top-emission type OLED display screen, disposing a thinned part in the organic layer, in a segment of the display screen where a display face is expected to be bent inwardly; or for a bottom-emission type OLED display screen, disposing the thinned part in the organic layer, in a segment of the display screen where the display face is expected to be bent outwardly.

According to an embodiment of the present disclosure, the organic layer is fabricated using an ink-jet printing.

According to an embodiment of the present disclosure, the method further comprises: fabricating another inorganic layer on the fabricated organic layer.

In order to provide a more clear understanding of objects, features and advantages of the present disclosure, the present disclosure will be further described hereinafter in detail and completely with reference to the attached drawings.

DETAILED DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings. In addition, the expression ". . . provided on . . . " used in the description may mean that one component is provided directly above another component, or else may mean that one component is provided above another component while there exists an intermediate layer between the two components.

Figure 1A:
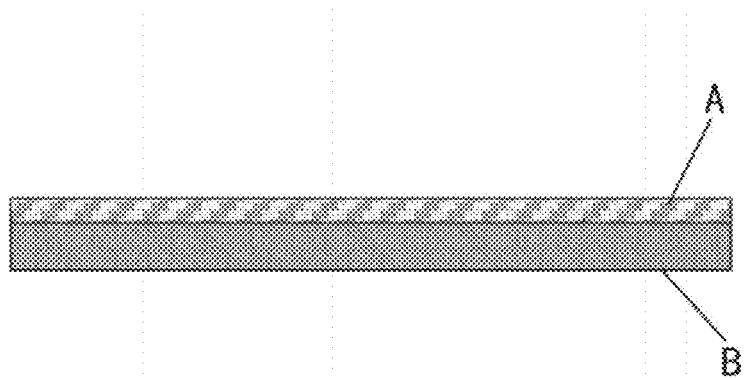
FIG. 1a is a schematic view showing a flexible display screen when in a non-bending state.
Figure 1B:
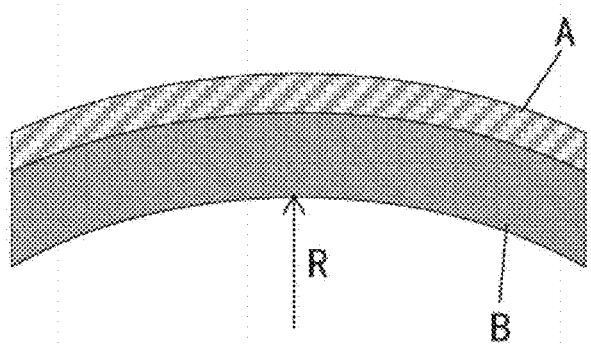
FIG. 1b is a schematic view showing a flexible display screen when in an outwardly bending state.
Figure 1C:
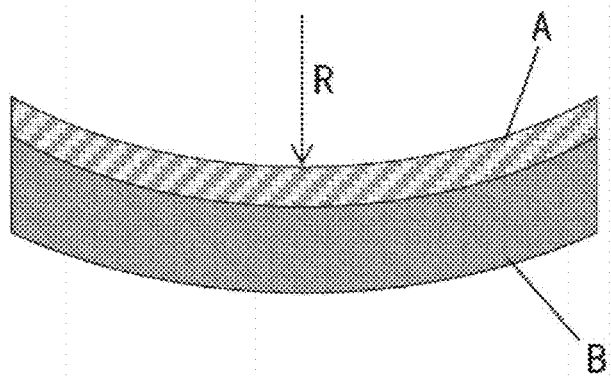
FIG. 1c is a schematic view showing a flexible display screen when in an inwardly bending state.

FIG. 1a is a schematic view showing a flexible display screen when in a non-bending state. Referring to FIG. 1a, an OLED display screen comprises a displaying side A and a non-displaying side B. FIG. 1b is a schematic view showing a flexible display screen when in an outwardly bending state. Referring to FIG. 1b, an outwardly-bent type OLED display screen, when it is bent, protrudes towards the displaying side A and correspondingly has a predefined bending radius R. FIG. 1c is a schematic view showing a flexible display screen when in an inwardly bending state, Referring to FIG. 1c, an inwardly-bent type OLED display screen, when it is bent, protrudes towards the non-displaying side B and correspondingly has a predefined bending radius R.

Figure 2:
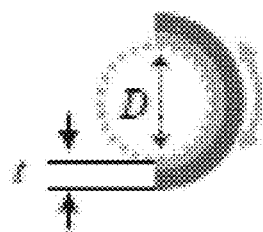
FIG. 2 is a schematic view showing a bending circle stress model.

The embodiments of the present disclosure aim to reduce a bending stress of the OLED display screen when it is bent, so as to prevent the OLED display screen from being broken and damaged at the bent area, thereby prolonging usage life of the OLED display screen. The bending stress of the OLED display screen, when it is bent, can be calculated by referring to a bending circle stress model. FIG. 2 is a schematic view showing a bending circle stress model. Referring to FIG. 2, a bending circle has a thickness of t and a diameter of D, here, a bending stress e in the bending circle can be calculated according to the following formula (1):

$$\varepsilon = t/2R \qquad (1)$$

in which, ε indicates a bending stress in the bending circle, t indicates a thickness of the bending circle, and R indicates a radius of the bending circle (D=2R).

It is known from the above formula that, the bending stress in the bending circle is inversely proportional to the radius of the bending circle and is proportional to the thickness of the bending circle. Considering that the radius of the flexible display screen is much larger than the thickness thereof, the radius of the bending circle makes a greater effect on the bending stress in the bending circle, and the effect of the thickness can be ignored. As a result, the effect of the bending radius of the bending circle is mainly taken into consideration in the present disclosure.

In accordance with a general inventive concept of the present disclosure, there is provided an OLED display screen, of which a basic structure is the same as conventional OLED display screen, and which comprises a flexible substrate, an OLED device and a packaging layer arranged and laminated orderly, and, herein, specific configuration of the OLED display screen is no longer described in details. However, considering that the packaging layer is easily to be damaged at the predefined bending region, in the OLED display screen according to embodiments of the present disclosure, the packaging layer comprises a reinforcement part located in a predefined bending region of the display screen, which is different from the conventional OLED display screen. As a result, it can prevent damages and failures of the packaging layer located in the predefined bending region and thus prolong usage life of the OLED display screen. The predefined bending region of the OLED display screen may be a fixed bending region of the display screen that is predetermined according to actual requirements, or an easily bent region of the display screen, located in anywhere of the display screen, for example, located in an intermediate area or a marginal area of the display screen.

Figure 3:
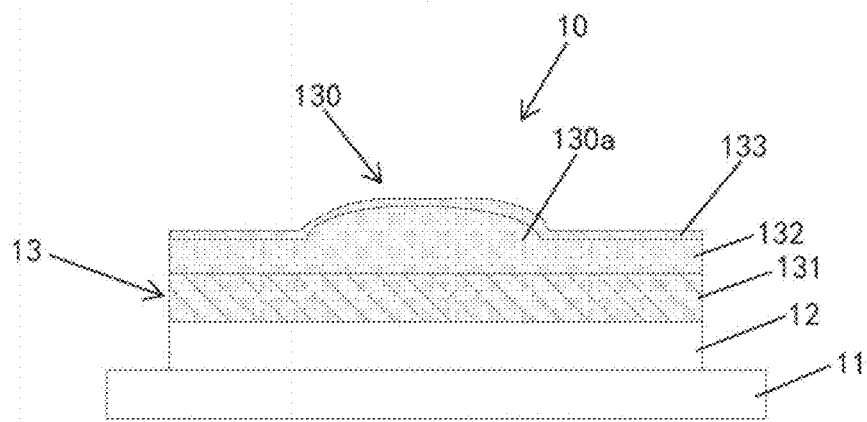
FIG. 3 is a structural schematic view of an outwardly-bent type OLED display screen according to an embodiment of the present disclosure.

FIG. 3 is a structural schematic view of an outwardly-bent type OLED display screen 10 according to an exemplary embodiment of the present disclosure, and a top-emission type OLED display screen is taken as an example. The display screen 10 has an outwardly-bent construction shown in FIG. 1b when it is bent. As shown in FIG. 3, the OLED display screen 10 comprises a flexible substrate 11, an OLED device 12 and a packaging layer 13 arranged and laminated orderly; and, the packaging layer 13 comprises a reinforcement part 130 located in a predefined bending region of the display screen.

Specifically, referring to FIG. 3, the packaging layer 13 comprises a first inorganic layer 131, an organic layer 132 and a second inorganic layer 133 arranged and laminated. The first inorganic layer 131 is provided above the OLED device 12, the organic layer 132 is provided above the first inorganic layer 131, and the second inorganic layer 133 is provided above the organic layer 132. The reinforcement part 130 is a thickened part 130a provided in the organic layer 132.

Provision of the thickened part at the predefined bending region can increase a radius of the bending circle at the bending region. Accordingly, in accordance with the above-mentioned formula (1), the bending stress at the bending region of the display screen 10 can be reduced, and thus, strength at the predefined bending region of the display screen is improved and usage life of the flexible display screen is prolonged. Moreover, since the organic layer generally has good ductility, provision of the thickened part in the organic layer can better ensure tenacity of the bending region and avoid fracture.

The predefined bending region of the display screen, shown in FIG. 3, is located at an intermediate area of the display screen, that is, nearly at one half of the display screen in a transverse length, so that the display screen is folded according to requirements, which facilitates portability of the display screen and saving of storage space, etc. Here, in order to prevent damage of the display screen due to repetition of the bending actions, the reinforcement part 130 can be provided at the intermediate area of the display screen.

In addition, according to actual requirements, the reinforcement part 130 may be also located at an intermediate area of the display screen in a longitudinal direction, that is, nearly at one half of the display screen in the longitudinal length.

In addition, the predefined bending region may be also located at an area between one third and one half of the display screen in a longitudinal or transverse length. In this way, the display screen can be folded into a smaller size, and, after the display screen is folded, the displaying will be presented in a relatively larger one of the remaining areas of the display screen so that image presented in the display screen will be viewed when the display screen is in a folded condition. Here, in order to prevent damage of the display screen due to repetition of the bending actions, the reinforcement part 130 may be provided at the area between one third and one half of the display screen in a longitudinal length or a transverse length.

The above merely is specific examples showing the location where the reinforcement part is provided. According to actual applications, the reinforcement part 130 may be located at any predefined bending portion of the display screen. Provided that the display screen has a plurality of predefined bending portions, the reinforcement parts may be provided at the respective bending portions.

In addition, FIG. 3 shows a three-layer construction in which the packaging layer 13 comprises the inorganic layers and the organic layer laminated alternately, although the present disclosure is not limited to this. According to requirements, the packaging layer 13 may comprise much more layers of inorganic layer and organic layer arranged alternately. Generally, after evaporating the OLED device, a layer of inorganic layer is firstly deposited and then a layer of organic layer is deposited. As the organic layer lacks water and oxygen barrier ability, one more layer of inorganic layer is required to be coated outside the organic layer. Provided that one layer of organic layer and one layer of inorganic layer are regarded as one group, after implementing depositions of N groups, one more layer of inorganic layer is deposited outside the outermost layer, that is, there totally are N+1 layers of inorganic layer and N layers of organic layer.

According to one embodiment of the present disclosure, provided that the organic layer 132, excepting the thickened part, has a thickness of h, then, an increment in thickness $\Delta h$ of the thickened part may be set to $\Delta h > 1.5\ h$. That is, an increment in thickness $\Delta h$ of the thickest portion of the thickened part in the organic layer 132 is not greater than 1.5 times of a thickness h of a remaining part of the organic layer 132. With the settings, on one hand the thickness of the display screen can be prevented from being increased, and on the other hand influence on flexibility of display screen and occurrence of defective deposition of a next inorganic layer, etc., can be avoided. Typically, a thickness of the thickened part is maximal at a bending point of the predefined bending region and is gradually decreased from the bending point towards both directions away from the bending point.

In accordance with the abovementioned formula (1), the bending stress in the bending circle is inversely proportional to the radius of the bending circle. Accordingly, proper thickness of the thickened part may be set according to size of the predefined bending radius of the predefined bending region in the OLED display screen. Specifically, when the predefined bending radius of the predefined bending region in the display screen 10 is small in size, the thickness of the thickened part 130a in the organic layer 132 may be increased properly. And, when the predefined bending radius of the predefined bending region in the display screen 10 is great in size, the thickness of the thickened part 130a in the organic layer 132 may be decreased properly.

Figure 4:
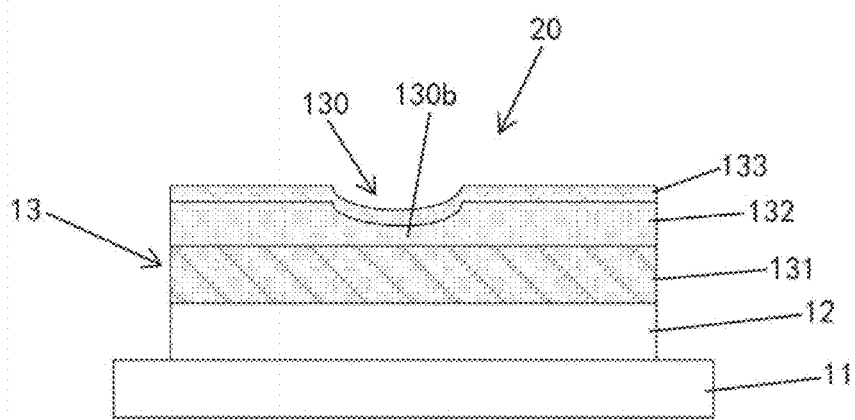
FIG. 4 is a structural schematic view of an inwardly-bent type OLED display screen according to another embodiment of the present disclosure.

FIG. 4 is a structural schematic view of an inwardly-bent type OLED display screen 20 according to another embodiment of the present disclosure, and a top-emission type OLED display screen is taken as an example. The display screen 20 has an inwardly-bent construction shown in FIG. 1c when it is bent. As shown in FIG. 4, the OLED display screen 20 has the same basic structure as that of the embodiment shown in FIG. 3, and comprises a flexible substrate 11, an OLED device 12 and a packaging layer 13 arranged and laminated orderly; and, the packaging layer 13 comprises a first inorganic layer 131, an organic layer 132 and a second inorganic layer 133 arranged and laminated. Different from that in the first embodiment shown in FIG. 3, in the OLED display screen 20 of the present embodiment, a reinforcement part 130 of the packaging layer 13 comprises a thinned part 130b provided in the organic layer 132.

For an inwardly-bent type OLED display screen, referring to the above formula (1), a radius of the bending circle at the bending region of the inwardly-bent type OLED display screen needs as well to be increased, in order to improve strength at the bending region. And, in order to increase the radius of the bending circle at the predefined bending region of the inwardly-bent type OLED display screen, the thickness of the predefined bending region may be reduced. Accordingly, referring to FIG. 4, according to one embodiment of the present disclosure, for the inwardly-bent type display screen 20, provision of the thinned part 130b at the predefined bending region can increase the radius of the bending circle at the bending region, so that the bending stress at the bending region of the display screen can be reduced, and thus, strength at the bending region of the display screen is improved and usage life of the flexible display screen is prolonged.

According to one embodiment of the present disclosure, provided that the organic layer 132, excepting the thinned part, has a thickness of h, then, a decrease in thickness $\Delta h$ of the thinned part may be set to $\Delta h \leq 0.5$ h. That is, a decrease in thickness $\Delta h$ of the thinnest portion of the thinned part in the organic layer 132 is not greater than 0.5 times of a thickness h of a remaining part of the organic layer 132. With the settings of the thickness of the thinned part, adverse influence on planarization effect of the organic layer 132 can be prevented. Typically, a thickness of the thinned part is minimal at a bending point of the predefined bending region and is gradually increased from the bending point towards both directions away from the bending point.

Similarly, the bending stress in the bending circle is inversely proportional to the radius of the bending circle. Accordingly, proper thickness of the thinned part may be set according to size of the predefined bending radius of the predefined bending region in the OLED display screen. Specifically, when the predefined bending radius of the predefined bending region in the display screen 20 is small in size, the thickness of the thinned part 130b in the organic layer 132 may be decreased properly. And, when the predefined bending radius of the predefined bending region in the display screen 20 is great in size, the thickness of the thinned part 130b in the organic layer 132 can be increased properly.

In addition, FIG. 3 and FIG. 4 show these cases where the entire OLED display screen is an outwardly-bent type OLED display screen or an inwardly-bent type OLED display screen, however, the present disclosure is not limited to this. According to other embodiments, the OLED display screen may include both a segment where display face is expected to be bent outwardly and a segment where display face is expected to be bent inwardly. For example, the OLED display screen may be the one presented in a wavy construction when it is bent, and includes a plurality of segments where display face is expected to be bent outwardly and a plurality of segments where display face is expected to be bent inwardly. In this case, in the segment, where display face is expected to be bent outwardly, of the display screen, a thickened part is correspondingly provided in the organic layer at the predefined bending region of the display screen. And, in the segment, where display face is expected to be bent inwardly, of the display screen, a thinned part is correspondingly provided in the organic layer at the predefined bending region of the display screen.

In addition, FIG. 3 and FIG. 4 show these cases where the OLED display screen is a top-emission type OLED display screen, however, the present disclosure is not limited to this. According to other embodiments, the OLED display screen may be a bottom-emission type OLED display screen. Contrary to the top-emission type OLED display screen, in a bottom-emission type OLED display screen, thinned part is provided in the organic layer at the predefined bending region of the display screen, at the segment, where display face is expected to be bent outwardly, of the display screen; and, thickened part is provided in the organic layer at the predefined bending region of the display screen, at the segment, where display face is expected to be bent inwardly, of the display screen. Specific settings of the thickened part and the thinned part are the same as those in the aforementioned embodiment and are omitted here.

In the OLED display screen according to the above embodiments of the present disclosure, based on orientations of the bending actions, a thickening process or a thinning process is performed on the organic layer of the packaging layer, at a bending-required region of the display screen, so as to provide the reinforcement part at the predefined bending region. In this way, on one hand reliability of the bending region is improved to avoid damage of the screen due to repetition of the bending actions, and on the other hand a coating process to the entire organic layer is saved so that manufacture cost is reduced.

Although the abovementioned embodiments are illustrated and described by taking the thickened part or the thinned part as an example of the reinforcement part in structure, forms of the reinforcement part are not limited to the thickened part or the thinned part, for example, the reinforcement part may be achieved by changing a material for the organic layer at the predefined bending region, such as addition of reinforcement material, or else, the reinforcement part may be achieved by increasing density of a material for the organic layer at the predefined bending region. There is no limitation on this according to the present disclosure.

The followings relates to a method of manufacturing the OLED display screen of FIGS. 3 and 4.

Firstly, a flexible glass substrate 11 is provided.

Then, layers, including an anode, an organic light-emitting layer, a cathode, an electron injection layer, an electron hole layer, etc., of an OLED device 12 are evaporated on flexible glass substrate 11.

Above the OLED device after the evaporation is completed, a first thin inorganic layer 131, which is for example a film layer of silicon nitride, silicon oxynitride or alumina and has a thickness of 0.25 μm~0.75 μm and implements a foundational protection on EL (organic electroluminescence) material, is deposited by means of processes including vacuum deposition, PECVD, or sputter, and so on.

After that, a layer of organic layer 132 is printed onto the film layer of silicon oxynitride by means of an ink-jet printing method. During the printing, a thickness of jetted ink of a local position in the organic layer 132 may be controlled to be different, to form a thickened part 130a (FIG. 3) or a thinned part 130b (FIG. 4), serving as the reinforcement part 130, at a position corresponding to the predefined bending region of the display screen.

Specifically, for an outwardly-bent type flexible display screen, referring to FIG. 3, a thickness h of the organic layer 132 excepting the predefined bending region may be set to 4~15 μm, and specifically it may be set in accordance with sizes of different field particles, and the like, while, an increment in thickness $\Delta h$ of the organic layer at the predefined bending region may be set to be not greater than 1.5 h. This thickness may be set to be maximal at a bending point, and is gradually decreased from the bending point as a center towards both directions away from the bending point, till it is equal to a thickness of the non-predefined bending region, in this way, a substantially convex arc-shaped reinforcement part 130 is formed. For an inwardly-bent type flexible display screen, referring to FIG. 4, similarly, a thickness of the organic layer 132 at the non-predefined bending region is set to h, and a decrease in thickness Δh of the organic layer at the predefined bending region may be set to be not greater than 0.5 h. This thickness may be set to be minimal at a bending point, and is gradually increased from the bending point as a center towards both directions away from the bending point, till it is equal to the thickness of the non-predefined bending region, in this way, a substantially concave arc-shaped reinforcement part 130 is formed.

Finally, a second layer of inorganic layer 133, such as a film layer of silicon nitride ($SiN_x$), is deposited on the organic layer 132 after the printing is completed. Here, manufacturing of the OLED display screen is finished.

The above merely describes briefly these fundamental steps for manufacturing a flexible OLED display screen, and steps for manufacturing other additional layers may be added according to actual requirements.

The above embodiments are merely used to illustrate principles and constructions of the present disclosure, but not to limit the present disclosure. It would be appreciated by those skilled in the art that all of changes and modifications, made within principles and spirit of the disclosure, should be included within the scope of the present disclosure, and the scope of which is defined in the claims. It should be noted that, terminologies "comprise", "include" and any other variations do not exclude other elements or method steps, and terminology "a", "an" or "one" does not exclude any additionally identical elements. In addition, any reference numerals presented in the claims should not be taken to limit the scope of the present disclosure.

What is claimed is:

1. An OLED display screen, comprising a flexible substrate, an OLED device and a packaging layer arranged and laminated orderly;
   wherein, the packaging layer comprises a reinforcement part located in a predefined bending region of the display screen; the packaging layer comprises at least one inorganic layer and at least one organic layer arranged and laminated; and the reinforcement part is provided in the organic layer and comprises a thickened part or a thinned part of the organic layer.

2. The OLED display screen of claim 1, wherein, the display screen has a display face for displaying images, and the display screen comprises a segment where the display face is expected to be bent outwardly and/or a segment where the display face is expected to be bent inwardly.

3. The OLED display screen of claim 2, wherein:
   the OLED display screen is a top-emission type OLED display screen, and, in the segment where the display face is expected to be bent outwardly of the display screen, the reinforcement part comprises the thickened part of the organic layer at the predefined bending region; or
   the OLED display screen is a bottom-emission type OLED display screen, and, in the segment where the display face is expected to be bent inwardly of the display screen, the reinforcement part comprises the thickened part of the organic layer at the predefined bending region.

4. The OLED display screen of claim 3, wherein, an increment in thickness of the thickened part is not greater than 1.5 times of a thickness of a remaining part of the organic layer.

5. The OLED display screen of claim 3, wherein, an increment in thickness of the thickened part increases with the decrease of a predefined bending radius or decreases with the increase of the predefined bending radius, at the predefined bending region of the display screen.

6. The OLED display screen of claim 3, wherein, a thickness of the thickened part is maximal at a bending point of the predefined bending region and is gradually decreased from the bending point towards both directions away from the bending point.

7. The OLED display screen of claim 2, wherein:
   the OLED display screen is a top-emission type OLED display screen, and, in the segment where the display face is expected to be bent inwardly of the display screen, the reinforcement part comprises the thinned part of the organic layer at the predefined bending region; or
   the OLED display screen is a bottom-emission type OLED display screen, and, in the segment where the display face is expected to be bent outwardly of the display screen, the reinforcement part comprises the thinned part of the organic layer at the predefined bending region.

8. The OLED display screen of claim 7, wherein, a decrease in thickness of the thinned part is not greater than 0.5 times of a thickness of a remaining part of the organic layer.

9. The OLED display screen of claim 7, wherein, a thickness of the thinned part decreases with the decrease of a predefined bending radius or increases with the increase of the predefined bending radius, at the predefined bending region of the display screen.

10. The OLED display screen of claim 7, wherein, a thickness of the thinned part is minimal at a bending point of the predefined bending region and is gradually increased from the bending point towards both directions away from the bending point.

11. The OLED display screen of claim 1, wherein, the predefined bending region is located at an intermediate area of the display screen in a transverse length or in a longitudinal length.

12. The OLED display screen of claim 1, wherein, the predefined bending region is located at an area between one third and one half of the display screen in a longitudinal length or a transverse length.

13. A display apparatus comprising the OLED display screen of claim 1.

14. A method of manufacturing the OLED display screen of claim 1, the method comprising:
   providing the flexible substrate;
   fabricating the OLED device on the flexible substrate;
   fabricating the inorganic layer on the OLED device; and
   fabricating the organic layer on the inorganic layer;
   wherein, in the process of fabricating the organic layer, a thickened part and/or a thinned part is formed on a local position of the organic layer, the local position corresponding to a predefined bending region of the display screen.

15. The method of claim 14, further comprising,
   forming a thickened part in the organic layer, in a segment where a display face is expected to be bent outwardly of the display screen, the OLED display screen being a top-emission type OLED display screen; or
   forming the thickened part in the organic layer, in a segment where the display face is expected to be bent inwardly of the display screen, the OLED display screen being a bottom-emission type OLED display screen.

16. The method of claim 14, further comprising,
   forming a thinned part in the organic layer, in a segment where a display face is expected to be bent inwardly of the display screen, the OLED display screen being a top-emission type OLED display screen; or
   forming the thinned part in the organic layer, in a segment where the display face is expected to be bent outwardly of the display screen, the OLED display screen being a bottom-emission type OLED display screen.

17. The method of claim 14, wherein, the organic layer is fabricated using ink-jet printing.

18. The method of claim 14, further comprising:
   fabricating another inorganic layer on the fabricated organic layer.

\* \* \* \* \*